United States Patent
Choi et al.

(10) Patent No.: US 10,547,025 B2
(45) Date of Patent: Jan. 28, 2020

(54) DISPLAY DEVICE

(71) Applicant: Samsung Display Co., Ltd., Yongin-si, Gyeonggi-do (KR)

(72) Inventors: Yoon Sun Choi, Seoul (KR); Sang Jo Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/623,215

(22) Filed: Jun. 14, 2017

(65) Prior Publication Data

US 2018/0013095 A1 Jan. 11, 2018

(30) Foreign Application Priority Data

Jul. 5, 2016 (KR) .................. 10-2016-0084911

(51) Int. Cl.
| | | |
|---|---|---|
| H01L 29/18 | (2006.01) | |
| H01L 33/00 | (2010.01) | |
| H01L 51/52 | (2006.01) | |
| H01L 27/32 | (2006.01) | |
| H01L 51/00 | (2006.01) | |

(52) U.S. Cl.
CPC ...... H01L 51/5253 (2013.01); H01L 27/3276 (2013.01); H01L 51/0097 (2013.01)

(58) Field of Classification Search
None
See application file for complete search history.

(56) References Cited

U.S. PATENT DOCUMENTS

| | | | | |
|---|---|---|---|---|
| 2005/0041399 | A1* | 2/2005 | Youker | H01L 23/5387 361/749 |
| 2006/0128077 | A1* | 6/2006 | Park | H01L 21/28202 438/149 |
| 2014/0042406 | A1 | 2/2014 | Degner et al. | |
| 2014/0183473 | A1* | 7/2014 | Lee | H01L 51/0097 257/40 |
| 2015/0091012 | A1* | 4/2015 | Namkung | G09G 3/34 257/72 |
| 2016/0275830 | A1* | 9/2016 | You | G06F 3/041 |

FOREIGN PATENT DOCUMENTS

| | | |
|---|---|---|
| KR | 10-2014-0122595 | 10/2014 |
| KR | 10-2014-0122597 | 10/2014 |
| KR | 10-2014-0122960 | 10/2014 |
| KR | 10-2015-0019876 | 2/2015 |
| KR | 10-2015-0061769 | 6/2015 |

* cited by examiner

Primary Examiner — Calvin Y Choi
(74) Attorney, Agent, or Firm — Lewis Roca Rothgerber Christie LLP

(57) ABSTRACT

A display device includes: a display panel having a bending area; and a protection film on a rear side of the display panel. The protection film includes a first protection film and a second protection film on respective sides of the bending area and separated from each other, and the first protection film and the second protection film each have a slanted side adjacent to the bending area.

16 Claims, 12 Drawing Sheets

DISPLAY DEVICE

CROSS-REFERENCE TO RELATED APPLICATION

This application claims priority to and the benefit of Korean Patent Application No. 10-2016-0084911, filed in the Korean Intellectual Property Office on Jul. 5, 2016, the entire content of which is incorporated herein by reference.

BACKGROUND

1. Field

Aspects of this disclosure relate to a display device.

2. Description of the Related Art

Display devices, such as organic light-emitting display devices and liquid crystal displays, are generally manufactured by generating a plurality of layers and elements on a substrate. Glass is often used for the substrate of the display device. However, the glass substrate is relatively heavy and easily broken. Further, the glass substrate is rigid, making it difficult to deform the display device. Recently, display devices using a flexible substrate that is light, strong against impacts, and easily deformed have been developed.

The display device using a flexible substrate may be manufactured (or configured) to bend at an edge where a pad portion, to which a flexible printed circuit film (FPC) for transmitting signals is connected, is arranged, thereby reducing dead space compared to the display device using the rigid substrate. When the dead space is reduced, a bezel width of the display device may be reduced and usage of an inner space of the display device may be increased so the display device may be manufactured to be more compact.

The above information disclosed in this Background section is for enhancement of understanding of the background of the present invention, and therefore, it may contain information that is not prior art.

SUMMARY

Embodiments of the present invention include a display device including a flexible substrate in which damage to wires thereon may be reduced or prevented.

An exemplary embodiment of the present invention provides a display device including: a display panel having a bending area; and a protection film on a rear side of the display panel. The protection film includes a first protection film and a second protection film on respective sides of the bending area and separated from each other, and the first protection film and the second protection film each include a slanted side adjacent to the bending area.

The first protection film and the second protection film may each have a first side and a second side opposite the first side. The first side may be attached to the display panel, and the second side may be wider than the first side.

The display panel may have a display area for displaying an image and a non-display area including a pad portion. The display area may overlap the first protection film, and the pad portion may overlap the second protection film.

The bending area may be in the non-display area.

The display device may further include a flexible printed circuit film connected to the pad portion.

The protection film may not overlap the bending area.

The protection film may be below the display panel before the display panel is bent, and a cross-sectional shape of facing sides of each of the first protection film and the second protection film may substantially be an inverted isosceles trapezoid.

The slanted side of each of the first protection film and the second protection film may be flat or curved.

The protection film may include polyethylene terephthalate, polyethylene naphthalate, polyimide, or polyethylene sulfide.

The protection film may have a thickness of about 50 to about 150 micrometers.

The protection film may be attached to the display panel by an adhesive layer.

The display panel may include a polarization layer, and the polarization layer may overlap the first protection film and may not overlap the second protection film before the display panel is bent.

According to exemplary embodiments of the present invention, sides (or edges) of a protection film provided around (or facing) a bending area of a flexible substrate for protecting the flexible substrate are inclined, thereby preventing the protection film from damaging wires on the flexible substrate.

DETAILED DESCRIPTION

Figure 1:
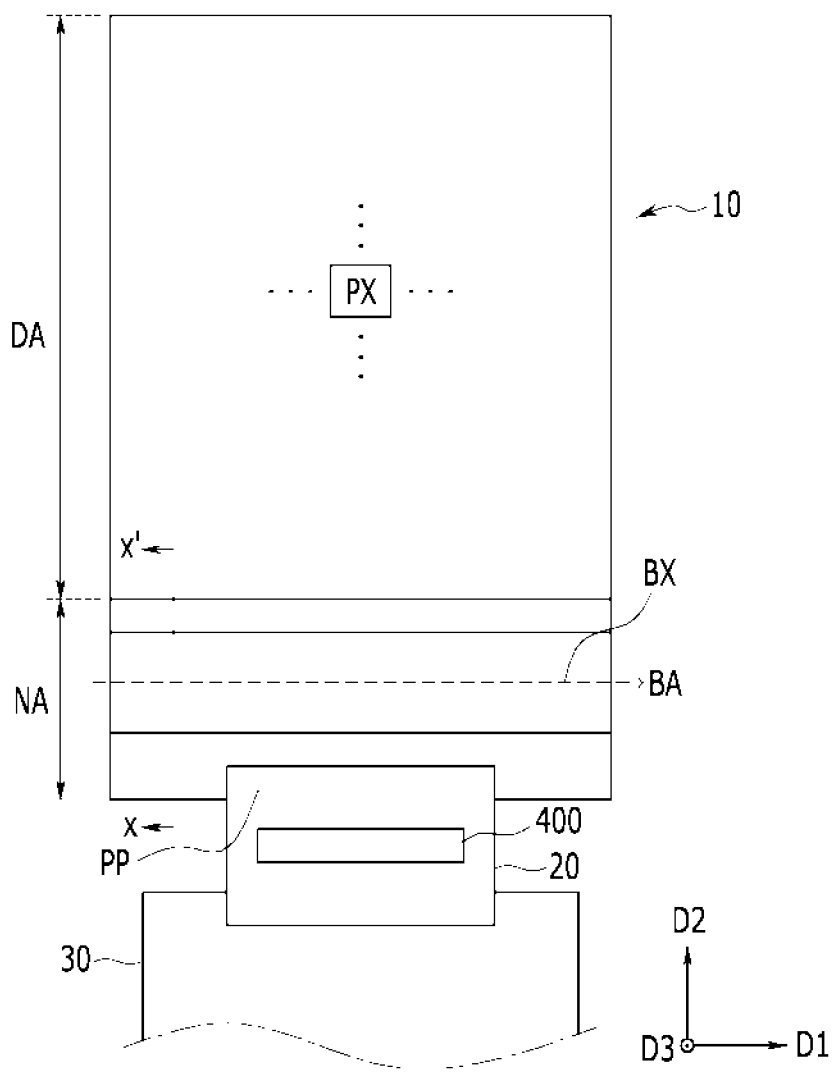
FIG. 1 is a top plan view of a display device according to an exemplary embodiment of the present invention.

The present invention will be described more fully hereinafter with reference to the accompanying drawings, in which exemplary embodiments of the present invention are shown. As those skilled in the art would realize, the described embodiments may be modified in various different ways, all without departing from the spirit and scope of the present invention.

Aspects and features that are unrelated to the description of the exemplary embodiments or are well-known to those skilled in the art may not be shown or described to make the description clear, and like reference numerals designate like elements throughout the specification.

The size and thickness of components shown in the drawings may be arbitrarily shown for better understanding and ease of description, and the present invention is not limited thereto. For example, in the drawings, the thickness of layers, films, panels, regions, etc., may be exaggerated for clarity.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be understood that when an element, such as a layer, film, region, or substrate is referred to as being "on" another element, it can be directly on the other element or intervening elements may also be present. When an element is referred to as being "directly on" another element, there are no intervening elements present. The word "on" or "above" means positioned above or below the object portion and does not necessarily mean positioned on the upper side of the object portion based on a gravitational direction.

In addition, unless explicitly described to the contrary, the words "include" and "comprise" and variations thereof, such as "includes," "including," "comprises," and "comprising," will be understood to imply the inclusion of the stated elements but not the exclusion of any other elements.

As used herein, the phrase "on a plane" indicates viewing the object portion from the top and the phrase "on a cross-section" indicates viewing a cross-section of the object portion vertically cut from the side thereof.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

A display device according to exemplary embodiments of the present invention will now be described with reference to the accompanying drawings. While a display device is exemplified, aspects and features of the present invention are applicable to various suitable types of electronic devices that use an anisotropic conductive film (ACF).

Figure 2:
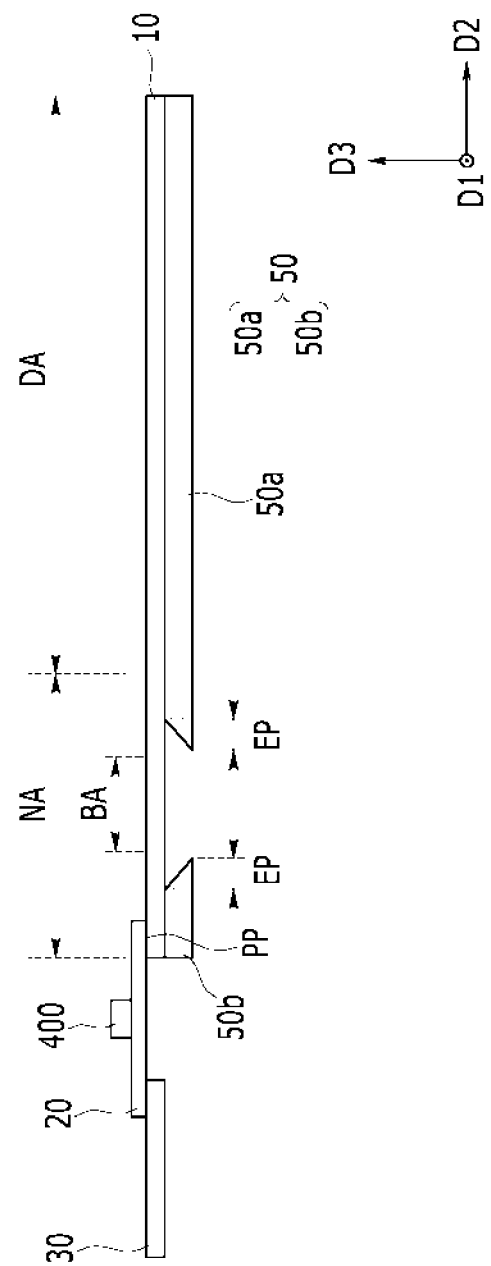
FIG. 2 is a side view of the display device shown in FIG. 1.
Figure 3:
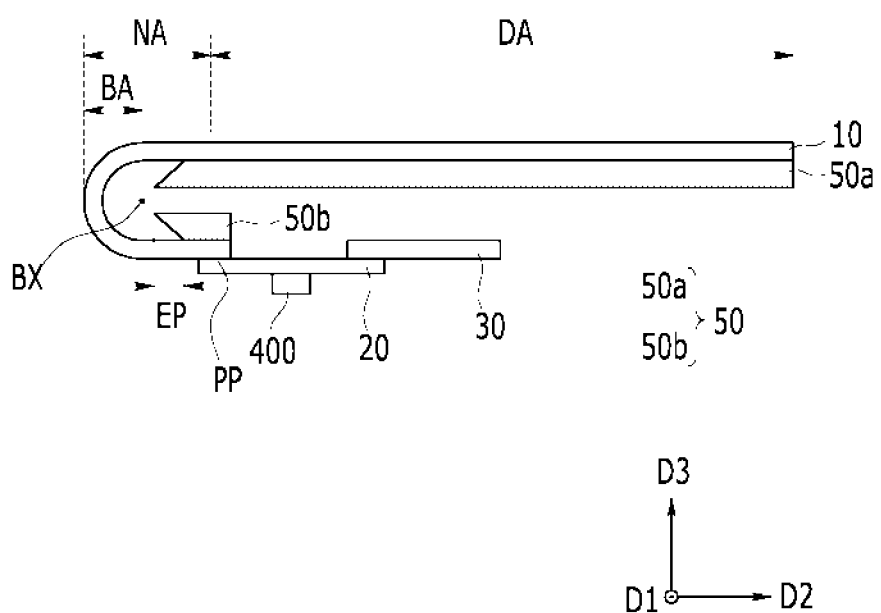
FIG. 3 is a side view of the display device shown in FIG. 1 in a bent state.
Figure 4:
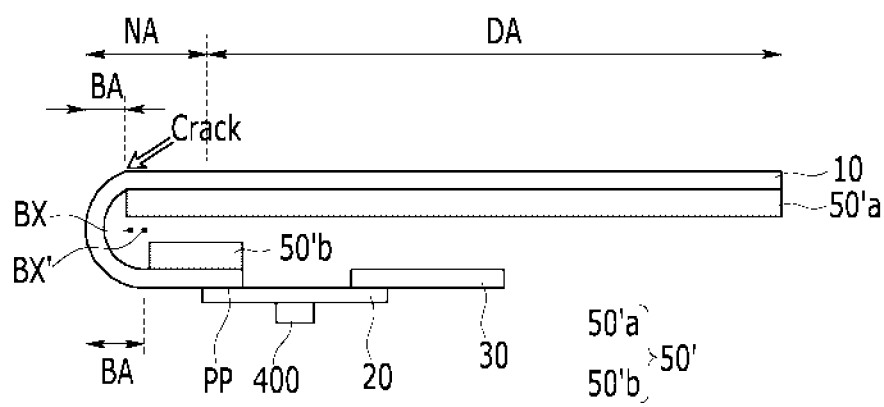
FIG. 4 is a side view of a display device according to a comparative example that is bent about an unintended bending axis.
Figure 5:
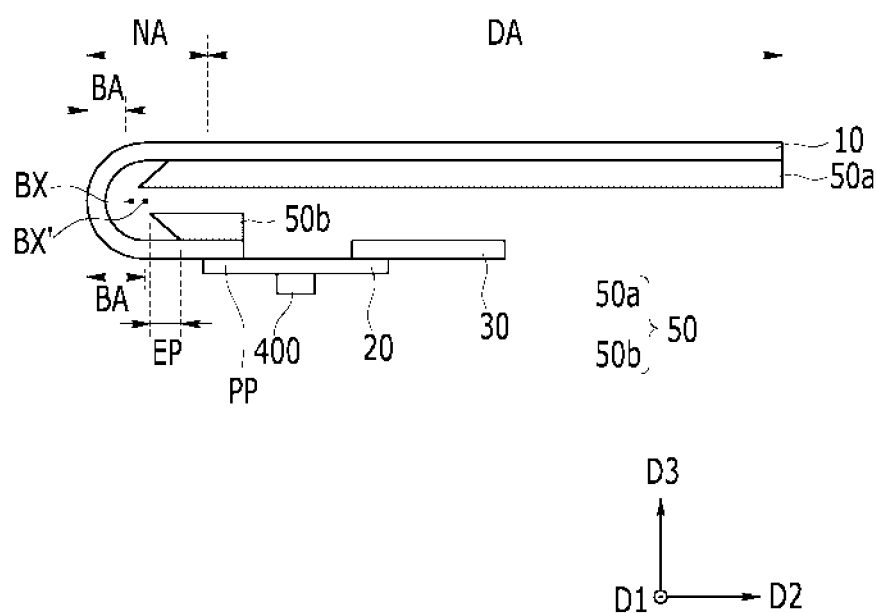
FIG. 5 is a side view of the display device shown in FIG. 1 that is bent about an unintended bending axis.

FIG. 1 is a top plan view of a display device according to an exemplary embodiment of the present invention, FIG. 2 is a side view of the display device shown in FIG. 1, and FIG. 3 is a side view of the display device shown in FIG. 1 in a bent state. FIG. 4 is a side view of a display device according to a comparative example that is bent about an unintended bending axis, and FIG. 5 is a side view of the display device shown in FIG. 1 that is bent about an unintended bending axis.

Referring to FIGS. 1-3, the display device includes a display panel 10 and flexible printed circuit films 20 and 30 connected to the display panel 10.

The display panel 10 includes a flexible substrate including a display area (DA), on which elements for displaying an image are disposed, and a non-display area (NA) outside of (e.g., surrounding a periphery of) the display area (DA), on which elements and/or wires for generating and/or transmitting various signals to the display area (DA) are disposed. In FIG. 1, a lower area (e.g., a lower edge) of the display panel 10 is indicated as the non-display area (NA); however, a right edge, a left edge, and/or an upper edge of the display panel 10 may also be a part of the non-display area (NA).

Pixels PX are exemplarily disposed in a matrix form in the display area (DA) of the display panel 10. Signal lines, such as gate lines and/or data lines are disposed in the display area (DA). The gate lines may extend in a first direction D1 (e.g., a row direction), and the data lines may extend in a second direction D2 (e.g., a column direction) crossing the first direction D1. Each pixel PX may be connected to one of the gate lines and one of the data lines to receive a gate signal and a data signal therefrom, respectively. In an organic light emitting device, for example, driving voltage lines for transmitting a driving voltage to the pixels PX extend in the second direction D2 in the display area (DA).

A pad portion (PP) including pads for receiving signals from outside of the display panel 10 is provided in the non-display area (NA) of the display panel 10. The pads of the pad portion (PP) are connected to wires disposed in the non-display area (NA). A first end of the first flexible printed circuit film 20 is attached to the pad portion (PP), and a second end of the first flexible printed circuit film 20 may be connected to the second flexible printed circuit film 30. The second flexible printed circuit film 30 may be exemplarily connected to an external printed circuit board (PCB) to transmit signals, such as image data.

A driving device for generating and/or processing various kinds of signals for driving the display panel 10 may be provided in the non-display area (NA) and may be provided on the first flexible printed circuit film 20, which is attached to the pad portion (PP). The driving device may include a data driver for applying data signals to the data lines, a gate driver for applying gate signals to the gate lines, and a signal controller for controlling the data driver and the gate driver.

As shown in FIGS. 1-3, the data driver may be an integrated circuit chip 400 mounted on the first flexible printed circuit film 20 and may be connected to the pad portion (PP) as a tape carrier package (TCP). In other embodiments, different from FIGS. 1-3, the data driver may be an integrated circuit chip mounted in the non-display area (NA) between the display area (DA) and the pad portion (PP). The gate driver may be an integrated circuit chip or may be integral with the display panel 10 at the non-display area (NA) on the left/right edge of the display panel 10. The signal controller may be formed by the same integrated circuit chip 400 as the data driver or may be a separate integrated circuit chip. When the integrated circuit chip 400 is installed in the non-display area (NA) of the display panel 10, the first flexible printed circuit film 20 may be omitted and the second flexible printed circuit film 30 may be attached to the pad portion (PP).

The display panel 10 includes a bending area (BA) between the display area (DA) and the pad portion (PP). The bending area (BA) traverses the display panel 10 in the first direction D1. The bending area (BA) may be bent with respect to the bending axis (BX), which extends parallel to the first direction D1, and for example, as shown in FIG. 3, the first and second flexible printed circuit films 20 and 30 may be provided under or behind (e.g., the bending area (BA) may be bent such that the first and second flexible printed circuit films 20 and 30 may be under or behind) the display area (DA). For example, wires for transmitting the signals that are input through the pads of the pad portion (PP) to the display area (DA) or the driving device are provided in the bending area (BA). In other embodiments, different from the illustrated exemplary embodiment, the bending area (BA) may be provided in the display area (DA) and the non-display area (NA) or it may be provided in (e.g., may be provided only in) the display area (DA).

Referring to FIGS. 2 and 3, a protection film 50 is attached under or below the display panel 10 for protecting the display panel 10. The protection film 50 may be exemplarily made of or may exemplarily include a plastic, such as polyethylene terephthalate (PET), polyethylene naphthalate (PEN), polyimide (PI), or polyethylene sulfide (PES) but is not limited thereto. The protection film 50 may exemplarily be about 50 to about 150 micrometers thick but is not limited thereto.

The protection film 50 is provided to cover a rear side of the display panel 10 but is not provided in the bending area (BA) to reduce bending stress at the bending area (BA). The protection film 50 includes a first protection film 50a provided to the right of the bending area (BA) and a second protection film 50b provided to the left of the bending area (BA) in FIG. 2. The display area (DA) may overlap the first protection film 50a, and the pad portion (PP) may overlap the second protection film 50b.

Sides of the first and second protection films 50a and 50b that are near the bending area (BA) are not perpendicular to flat surfaces of the first and second protection films 50a and 50b and are inclined. Angles between the slanted sides of the first and second protection films 50a and 50b and the display panel 10 before the display panel 10 is bent (e.g., when the display panel 10 is in a flat state) may be acute, and for example, the angles may be equal to or less than about 80 degrees, about 60 degrees, about 45 degrees, or about 30 degrees. Around the bending area (BA), an opposite side (e.g., a second side or a side facing away from the display panel 10) of each of the first and second protection films 50a and 50b is longer than a side (e.g., a first side) thereof attached to the display panel 10. Therefore, the second side is wider (or longer) than the first side, and referring to FIG. 2, before the display panel 10 is bent, a cross-sectional shape of the facing sides of each of the first and second protection films 50a and 50b may be a substantially inverted isosceles trapezoid.

Referring to FIG. 4, different from an exemplary embodiment of the present invention, sides of first and second protection films 50'a and 50'b facing the bending area (BA) are perpendicular with respect to flat surfaces of the first and second protection films 50'a and 50'b (e.g., the sides of the first and second protection films 50'a and 50'b facing the bending area (BA) are not inclined). When the protection film 50' does not cover the bending area (BA) and the display panel 10 is bent about unintended bending axis (BX') (e.g., is bent about an axis other than a predetermined bending axis (BX)), for example, the display panel 10 portion that substantially corresponds to the side of the first protection film 50'a may be severely bent or may be broken due to the side of the first protection film 50'a, and excessive bending stress may be applied to wires disposed on the corresponding portion of the display panel 10 such that the wires may be cracked or broken.

Referring to FIG. 5, when the display panel 10 is bent about (or with respect to) the unintended bending axis (BX'), the display panel 10 is not severely bent or stressed at the sides of the first and second protection films 50a and 50b because the sides of the first and second protection films 50a and 50b facing the bending areas (BA) are slanted or inclined. Therefore, damage to wires that may occur in the comparative example shown in FIG. 4 may be prevented or reduced. The second side of the first and second protection films 50a and 50b opposite to the first side that is attached to the display panel 10 is longer than the first side such that a region of the display panel 10 protected by the protection film 50 may substantially correspond to (e.g., may be substantially the same size as) the comparative example shown in FIG. 4. The slanted edges of the protection film 50 may be formed, for example, by cutting end portions (EP) (e.g., a portion that corresponds to the slanted sides) of the protection film 50.

The end portions (EP) of the first and second protection films 50a and 50b may be variously slanted, and several examples are shown in FIGS. 6-9.

FIGS. 6-9 are cross-sectional views of an end portion of a protection film according to exemplary embodiments of the present invention.

FIGS. 6-9 show the shape of the end portion (EP) of the first protection film 50a according to exemplary embodiments of the present invention, and the end portion (EP) of the second protection film 50b of each exemplary embodiment may have a shape that corresponds to the end portion (EP) of the first protection film 50a. Accordingly, a repetitive description of the end portion (EP) of the second protection film 50b may be omitted.

Figure 6:
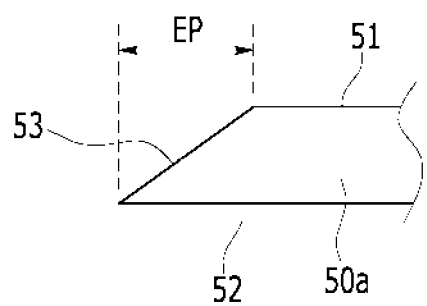
FIGS. 6-9 are cross-sectional views of an end portion of a protection film according to exemplary embodiments of the present invention.

Referring to FIG. 6, the end portion (EP) of the first protection film 50a has a right triangular shape in a cross-sectional view with a flat slanted side. A lateral slanting degree of the end portion (EP), that is, an angle between a second side 52 (e.g., a bottom) and a side 53 (e.g., a slanted side) of the end portion (EP) may be determined in consideration of a thickness of the first protection film 50a and a curvature radius of the bending area so that a sharp end of the end portion (EP) may not touch the bending area of the display panel 10 when the display panel 10 is bent. For example, when the first protection film 50a is about 0.1 millimeters thick and the curvature radius of the bending area is about 0.4 millimeters, the slanting degree may be equal to or less than about 21 degrees.

Figure 7:
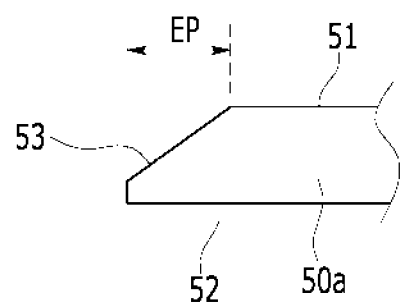
Figure 8:
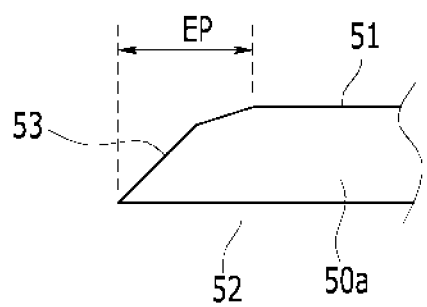
Figure 9:
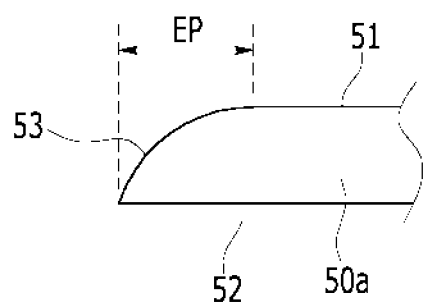

Referring to FIG. 7, an end portion (EP) of the first protection film 50a according to another exemplary embodiment is shown. The end portion (EP) of the first protection film 50a shown in FIG. 7 is inclined, similar to the exemplary embodiment shown in FIG. 6, but has a substantially trapezoidal shape in a cross-sectional view (e.g., the end of the end portion (EP) is not sharp or does not come to a point). Referring to FIG. 8, an end portion (EP) of the first protection film 50a according to another exemplary embodiment is shown. The end portion (EP) of the first protection film 50a shown in FIG. 8 has a slanted side that is not flat but is bent, and referring to FIG. 9, a slanted side of an end portion (EP) according to another exemplary embodiment is curved. As described, the end portion (EP) of the first protection film 50a provided toward the bending area (BA) may have various suitable shapes, and the second side 52 of the first protection film 50a that is opposite to a first side 51 thereof that is attached to the display panel 10 is wider (or longer) than the first side 51 such that the side 53 has a gentle slanted shape.

Figure 10:
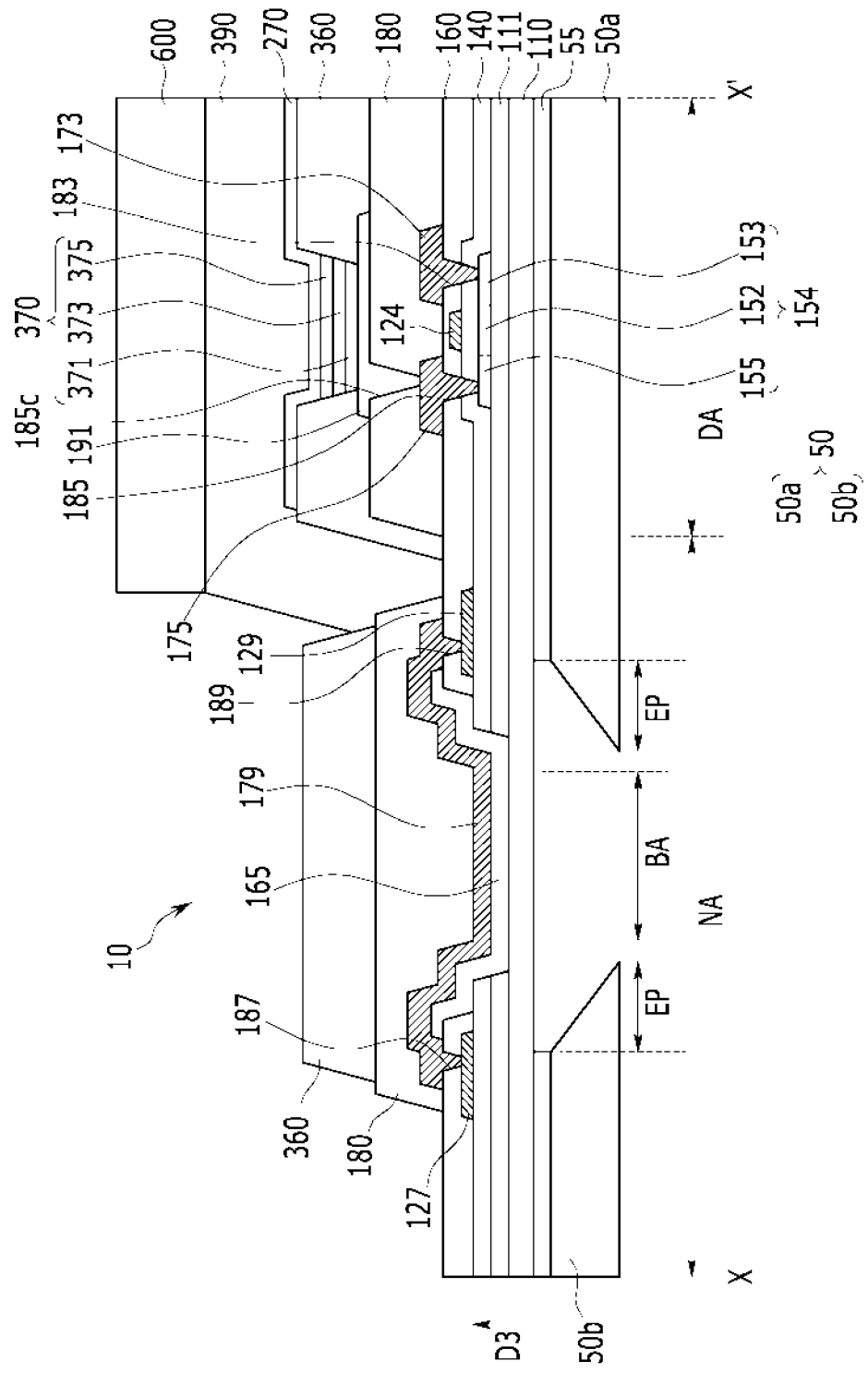
FIG. 10 is a cross-sectional view along the line X-X' of FIG. 1.

FIG. 10 shows a cross-sectional view of a stacked structure of the display panel 10 including the bending area (BA) together with a pixel PX of the display panel 10 with respect to the line X-X' of FIG. 1. As an exemplarily embodiment, the pixel PX of the display panel 10 will be described as an organic light-emitting display device, but the present invention is not limited thereto.

Referring to FIG. 10, the display panel 10 includes a flexible substrate 110 and a plurality of layers provided thereon. A plurality of pixels PX are disposed in the display area (DA). To avoid complicating the drawing, only one pixel PX is illustrated in FIG. 10.

For example, the flexible substrate 110 may be made of a plastic, such as polyimide (PI), polyamide (PA), or polyethylene terephthalate (PET). The flexible substrate 110 may exemplarily be about 10 to about 50 micrometers thick but is not limited thereto.

A buffer layer 111 for preventing spreading of impurities that degrade a semiconductor characteristic and preventing permeation of moisture is provided on the flexible substrate 110. The buffer layer 111 may include an inorganic material, such as a silicon oxide ($SiO_x$), a silicon nitride ($SiN_x$), aluminum oxide ($Al_2O_3$), hafnium oxide ($HfO_3$), or yttrium oxide ($Y_2O_3$). The buffer layer 111 may be formed on an entire surface of the substrate 110 but may not be formed in the bending area (BA). The buffer layer 111 may be provided in the flexible substrate 110.

A semiconductor 154 may be provided on the buffer layer 111. The semiconductor 154 includes a channel region 152 and source and drain regions 153 and 155 provided on respective sides of the channel region 152 and formed through doping (e.g., the source region 153 and the drain region 155 may be doped). The semiconductor 154 may include a polysilicon, an oxide semiconductor, or amorphous silicon.

A gate insulating layer 140 including an inorganic material, such as a silicon oxide or a silicon nitride, may be provided on the semiconductor 154. The gate insulating layer 140 may not be provided in the bending area (BA).

A gate conductor including a gate line, a gate electrode 124, a first wire portion 127, and a second wire portion 129 may be provided on the gate insulating layer 140. The gate conductor may include a metal, such as molybdenum (Mo), copper (Cu), aluminum (Al), silver (Ag), chromium (Cr), tantalum (Ta), or titanium (Ti), or a metal alloy thereof. For example, the metal may be a molybdenum-based metal, such as molybdenum or a molybdenum alloy. The gate electrode 124 may overlap the channel region 152 of the semiconductor 154. The first wire portion 127 may be connected to a pad of the pad portion (PP), and the second wire portion 129 may be connected to the display area (DA) or a driving device.

An inter-layer insulating layer 160 may be provided on the gate insulating layer 140 and the gate conductor. A contact opening 183 (e.g., a contact hole) overlapping the source region 153 of the semiconductor 154 and a contact opening 185 (e.g., a contact hole) overlapping the drain region 155 may be formed in the inter-layer insulating layer 160 and the gate insulating layer 140. A contact opening 187 (e.g., a contact hole) overlapping the first wire portion 127 and a contact opening 189 (e.g., a contact hole) overlapping the second wire portion 129 may be formed in the inter-layer insulating layer 160. The inter-layer insulating layer 160 may include an inorganic material, such as a silicon oxide, a silicon nitride, a silicon oxynitride (SiON), or a silicon oxyfluoride (SiOF). The inter-layer insulating layer 160 may not be provided in the bending area (BA).

A data conductor including a data line, a source electrode 173, a drain electrode 175, and a connection wire portion 179 may be provided on the inter-layer insulating layer 160. In the bending area (BA), a protective layer 165 may be provided between the substrate 110 and the connection wire portion 179. The protective layer 165 may include an organic material.

The source electrode 173 and the drain electrode 175 may be connected to the source region 153 and the drain region 155 of the semiconductor 154 through the contact openings 183 and 185. The connection wire portion 179 may connect the first wire portion 127 and the second wire portion 129 through the contact openings 187 and 189 formed in the inter-layer insulating layer 160.

The data conductor may exemplarily include a metal, such as copper (Cu), aluminum (Al), silver (Ag), molybdenum (Mo), chromium (Cr), gold (Au), platinum (Pt), palladium (Pd), tantalum (Ta), tungsten (W), titanium (Ti), or nickel (Ni), or a metal alloy thereof. The data conductor may exemplarily be made of aluminum with a low Young's modulus or an aluminum-based metal, such as an aluminum alloy. In such an embodiment, the connection wire portion 179 provided in the bending area (BA) has a relatively low stress-strain relationship, and therefore, for example, when the connection wire portion 179 is bent to have a small curvature radius, for example, of several hundred micrometers, the risk of the connection wire portion 179 being cut or degraded may be reduced. The data conductor may be formed to have multiple layers, and for example, the data conductor may have a triple-layered structure of titanium/aluminum/titanium.

The gate electrode 124, the source electrode 173, and the drain electrode 175 together with the semiconductor 154 form a transistor. The illustrated transistor may be a driving transistor in a pixel circuit of the organic light-emitting device (e.g., an organic light-emitting diode). Regarding the illustrated transistor, the gate electrode 124 is provided above the semiconductor 154 such that the illustrated transistor may be referred to as a top-gate transistor. However, the structure of the illustrated transistor is not limited thereto. The illustrated transistor may be modified in many suitable ways, for example, it may be a bottom-gate transistor in which the gate electrode is provided below the semiconductor.

A passivation layer 180 may be provided on the data conductor. The passivation layer 180 (e.g., an insulating layer) may have a flat surface (e.g., may planarize the underlying layers) to increase light-emitting efficiency of the organic light-emitting element to be formed thereon, and the passivation layer 180 may include an organic material. A contact opening 185c (e.g., a contact hole) overlapping the drain electrode 175 may be formed in the passivation layer 180. In the bending area (BA), the passivation layer 180 may be provided on the connection wire portion 179 such that the connection wire portion 179 may be provided between the protective layer 165 and the passivation layer 180. As such, the connection wire portion 179 may be prevented from being damaged upon bending by the protective layer 165 and the passivation layer 180, which may be an organic material.

A pixel electrode 191 may be provided on the passivation layer 180. The pixel electrode 191 of the pixel PX may be connected to the drain electrode 175 through the contact opening 185c in the passivation layer 180. The pixel electrode 191 may be made of a reflective conductive material, a semi-reflective conductive material, or a transparent conductive material.

A pixel definition layer 360 including an opening for exposing the pixel electrode 191 may be provided on the passivation layer 180. The opening in the pixel definition layer 360 may define each pixel area. In the bending area (BA), the pixel definition layer 360 may be provided on the passivation layer 180 to overlap the connection wire portion 179.

A light emitting member 370 is provided on the pixel definition layer 360 and the pixel electrode 191. The light emitting member 370 may include a first organic common layer 371, an emission layer 373, and a second organic common layer 375 that are sequentially stacked.

The first organic common layer 371 may include a hole injection layer and/or a hole transfer layer. When these layers are included, the hole injection layer and the hole transfer layer may be sequentially stacked. The first organic common layer 371 may be formed throughout the entire surface of the display area in which the pixels PX are disposed, or it may be formed in (e.g., may only be formed in) the respective pixel areas.

The emission layer 373 may be provided on the pixel electrode 191 of the corresponding pixel. The emission layer 373 may be made of an organic material for intrinsically displaying light of primary colors, such as red, green, and blue, and may have a structure in which a plurality of organic material layers for displaying light of different colors are stacked. The emission layer 373 may include a white color emission layer.

The second organic common layer 375 may exemplarily include an electron transfer layer and/or an electron injection layer. When the second organic common layer 375 includes these layers, the electron transfer layer and the electron injection layer may be sequentially stacked.

A common electrode 270 for transmitting a common voltage may be provided on the light emitting member 370. The common electrode 270 may be made of a transparent conductive material, such as ITO or IZO, or may be formed by thinly stacking a metal, such as calcium (Ca), barium (Ba), magnesium (Mg), aluminum (Al), or silver (Ag), to have light permeability (e.g., to be light transmissive). The pixel electrode 191, the light emitting member 370, and the common electrode 270 of each pixel together configure or provide a light-emitting device.

An encapsulation layer 390 is provided on the common electrode 270. The encapsulation layer 390 may encapsulate the light emitting member 370 and the common electrode 270 to prevent permeation of external moisture or oxygen. The encapsulation layer 390 may include a layer including an inorganic material and may further include a layer including an organic material. The encapsulation layer 390 may not be provided in the bending area (BA). A polarization layer 600 for preventing reflection of external light may be disposed on the encapsulation layer 390. The polarization layer 600 may not overlap the bending area (BA).

The above-described protection film 50 is provided below the flexible substrate 110. The protection film 50 is attached to the flexible substrate 110 by an adhesive layer 55, such as a pressure sensitive adhesive (PSA) or an optically clear adhesive (OCA). The protection film 50 is not provided in the bending area (BA), and it is separated into the first protection film 50a and the second protection film 50b on respective sides of the bending area (BA). The end portions (EP) of the first protection film 50a and the second protection film 50b provided near (or facing) the bending area (BA) include a slanted side that is not attached to the flexible substrate 110. When a portion of the display panel 10 is unintentionally bent and/or when the display panel 10 is processed, the display panel 10 (e.g., the substrate 110 of the display panel 10) may contact the slanted side of the end portions (EP) such that excessive bending of the display panel 10 may be prevented, thereby reducing or minimizing bending stress applied to the wires.

As an insulating layer, the display area (DA) may include layers including inorganic materials (hereinafter, inorganic material layers) (e.g., layers 111, 140, 160, and 390) and layers including organic materials (hereinafter, organic material layers) (e.g., layers 180 and 360). The bending area (BA) provided in the non-display area (NA) may include the organic material layers 165, 180, and 360 but does not include the inorganic material layers. The inorganic material layers are easily cracked when bent, and the wires may be damaged by the cracking. In some embodiments, the bending area (BA) includes no inorganic material layers so it may be bent to have a small curvature radius (e.g., several hundreds of micrometers) without damaging or degrading the bending area (BA). Further, the protection film 50 is not attached below the substrate 110 at the bending area (BA) so the bending stress may be reduced and the bending area (BA) may be further easily bent to have a small curvature radius.

Figure 11:
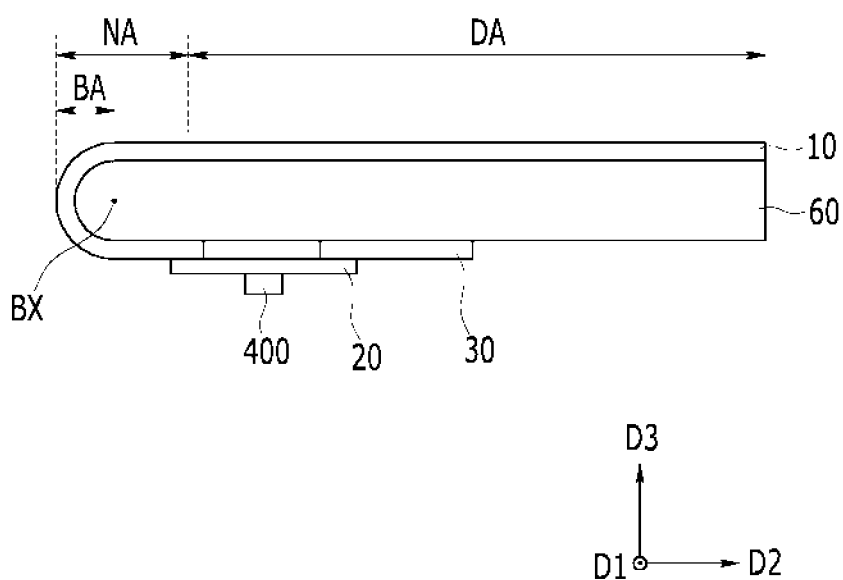
FIG. 11 is a side view of a display device according to an exemplary embodiment of the present invention in a bent state.
Figure 12:
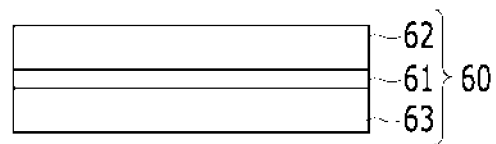
FIG. 12 illustrates a stacked structure of a supporter shown in FIG. 11.

FIG. 11 is a side view of a display device according to an exemplary embodiment of the present invention in a bent configuration, and FIG. 12 shows a stacked structure of a supporter shown in FIG. 11.

Different from the above-described exemplary embodiments, in the exemplary embodiment shown in FIG. 11, a supporter 60 for maintaining the curvature of the bending area (BA) is provided, instead of the protection film, on the rear side of the display panel 10. An end portion of the supporter 60 contacting the bending area (BA) is formed to be rounded (e.g., an end portion of the supporter 60 has a rounded shape) to satisfy (e.g., to correspond to or substantially match) the designed curvature radius of the bending area (BA). Hence, the bending area (BA) may be bent to have the designed curvature radius while surrounding the end portion of the supporter 60, and the bending area (BA) may maintain the bent state with the designed curvature radius after it is bent. Further, when an external force is applied to the bent portion (e.g., the bent bending area (BA)), because the supporter 60 is provided in a space of the bent portion (e.g., is provided under the bent portion) to support the bent portion, for example, the bent portion may not be pressurized in the third direction D3 or may not be deformed (e.g., unintentionally deformed) and the wires thereon may not be damaged.

Referring to FIG. 12, the supporter 60 may include a support layer 61 and adhesive layers 62 and 63 provided on respective sides thereof.

The support layer 61 may exemplarily be made of a plastic, such as polypropylene, polyethylene terephthalate, polyimide, or polyolefin. The adhesive layers 62 and 63 may be provided to allow the display panel 10 to adhere to the supporter 60. The adhesive layers 62 and 63 may use (or may be) an acryl-based resin or an epoxy-based resin but are not limited thereto. Each of the adhesive layers 62 and 63 may include a plurality of layers, and in some embodiments, may exemplarily include a cushion layer between the adhesive layers 62 and 63. As a non-limiting example, the adhesive layer may include an acryl-based adhesive, and the cushion layer may include a polyolefin.

While the present invention has been described in connection with what is presently considered to be practical exemplary embodiments, it is to be understood that the present invention is not limited to the disclosed exemplary embodiments but is intended to cover various modifications and equivalent arrangements included within the spirit and scope of the appended claims and their equivalents.

What is claimed is:

1. A display device comprising:
    a display panel having a bending area; and
    a protection film on a rear side of the display panel, the protection film comprising a first protection film and a second protection film, which are each a single layer, on respective sides of the bending area and separated from each other, the first protection film and the second protection film each having a slanted side adjacent to the bending area, the slanted sides being slanted with respect to the display panel when the display panel and the protection film are in a flat state.

2. The display device of claim 1, wherein the first protection film and the second protection film each have a first side and a second side opposite to the first side, the first side being attached to the display panel, and the second side being wider than the first side.

3. The display device of claim 1, wherein the display panel has a display area for displaying an image and a non-display area comprising a pad portion, the display area overlapping the first protection film, and the pad portion overlapping the second protection film.

4. The display device of claim 3, wherein the bending area is in the non-display area.

5. The display device of claim 3, further comprising a flexible printed circuit film connected to the pad portion.

6. The display device of claim 1, wherein the protection film does not overlap the bending area.

7. The display device of claim 1, wherein the protection film is below the display panel before the display panel is bent, and
    wherein a cross-sectional shape of facing sides of each of the first protection film and the second protection film is substantially an inverted isosceles trapezoid.

8. The display device of claim 1, wherein the slanted side of each of the first protection film and the second protection film is flat.

9. The display device of claim 1, wherein the slanted side of each of the first protection film and the second protection film is curved.

10. The display device of claim 1, wherein the protection film comprises polyethylene terephthalate, polyethylene naphthalate, polyimide, or polyethylene sulfide.

11. The display device of claim 1, wherein the protection film has a thickness of about 50 to about 150 micrometers.

12. The display device of claim 1, wherein the protection film is attached to the display panel by an adhesive layer.

13. The display device of claim 1, wherein the display panel comprises a polarization layer, the polarization layer overlapping the first protection film and not overlapping the second protection film before the display panel is bent.

14. The display device of claim 1, wherein each of the first protection film and the second protection film has a first side on the rear side of the display panel and a second side opposite the first side, and
    wherein the slanted side of each of the first protection film and the second protection film is continuous from the first side to the second side thereof.

15. The display device of claim 1, wherein:
    the first protection film and the second protection film each have a first side attached to the display panel,
    an angle between the slanted side and the first side of the first protection film is an obtuse angle, and
    an angle between the slanted side and the first side of the second protection film is an obtuse angle.

16. The display device of claim 1, wherein the slanted side of the first protection film does not contact the slanted side of the second protection film.

* * * * *